(12) United States Patent
Gupta et al.

(10) Patent No.: US 8,378,503 B2
(45) Date of Patent: Feb. 19, 2013

(54) APPARATUS FOR THERMAL CONTROL OF SEMICONDUCTOR CHIP ASSEMBLY AND UNDERFILL

(75) Inventors: Vikas Gupta, Dallas, TX (US); Jeremias Perez Libres, Garland, TX (US); Joseph Edward Grigalunas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/341,011

(22) Filed: Dec. 30, 2011

(65) Prior Publication Data

US 2012/0097095 A1 Apr. 26, 2012

Related U.S. Application Data

(63) Continuation of application No. 11/463,985, filed on Aug. 11, 2006, now Pat. No. 8,110,438.

(51) Int. Cl.
*H01L 23/28* (2006.01)

(52) U.S. Cl. . 257/778; 257/787; 257/789; 257/E21.503; 118/69

(58) Field of Classification Search .................. 257/778, 257/787–789, 737–738, 701
See application file for complete search history.

(56) References Cited

U.S. PATENT DOCUMENTS

| | | | | |
|---|---|---|---|---|
| 5,906,682 A | * | 5/1999 | Bouras et al. | 118/712 |
| 6,245,583 B1 | * | 6/2001 | Amador et al. | 438/14 |

* cited by examiner

*Primary Examiner* — Thanh Nguyen
(74) *Attorney, Agent, or Firm* — Steven A. Shaw; W. James Brady; Frederick J. Telecky, Jr.

(57) ABSTRACT

Apparatus for assembling a semiconductor device has a plate with body and a surface heatable to a controlled a temperature profile from location to location across the plate. Mesas at same temperature of plate protrude from the surface are configured to support a portion of the substrate. Movable capillaries have openings for blowing cooled gas onto selected locations of the assembly. At least one movable syringe movable has an opening for dispensing a polymer precursor.

8 Claims, 7 Drawing Sheets

US 8,378,503 B2

APPARATUS FOR THERMAL CONTROL OF SEMICONDUCTOR CHIP ASSEMBLY AND UNDERFILL

CROSS REFERENCE TO RELATED APPLICATIONS

This application is a Continuation of and claims priority to U.S. patent application Ser. No. 11/463,985 filed on Aug. 11, 2006 issued on Feb. 7, 2012 as U.S. Pat. No. 8,110,438. Said application incorporated herein by reference.

FIELD

Embodiments of the invention are related in general to the field of electronic systems and semiconductor devices and more specifically to structure of void-free underfilling the gap of flip-chip electronic assemblies.

DESCRIPTION OF THE RELATED ART

It is well known in the so-called flip-chip technology how to mount an integrated circuit chip to a substrate such as a printed circuit board by solder bump interconnections. After the assembly process, the integrated circuit chip is spaced apart from the printed circuit substrate by a gap. The solder bump interconnections extend across the gap and connect contact pads on the integrated circuit chip to terminal pads on the printed circuit substrate to attach the chip and then conduct electrical signals, power and ground potential to and from the chip for processing. Similarly, after packaged semiconductor devices of the ball grid array families have been assembled to motherboards by means of solder bumps connections, the bumps define a gap between the packaged device and the board.

There is a significant difference between the coefficient of thermal expansion (CTE) between the semiconductor material used for the chip and the material typically used for the substrate; for instance, with silicon as the semiconductor material and plastic FR-4 as substrate material, the difference in CTE is about an order of magnitude.

As a consequence of the CTE difference, mechanical stresses are created when the assembly is subjected to thermal cycling during use or testing. These stresses tend to fatigue the solder bump interconnections, resulting in cracks and thus eventual failure of the assembly. In order to strengthen the solder joints without affecting the electrical connection, the gap is customarily filled with a polymeric material (containing inorganic fillers), which encapsulates the bumps and fills any space in the gap between the semiconductor chip and the substrate. For example, in the well-known "C-4" process developed by the International Business Machines Corporation, viscous polymeric precursors are used to fill the space in the gap between the silicon chip and the ceramic substrate (see also IBM J. Res. Develop., vol. 13, pp. 226-296, 1969).

The polymeric precursor, sometimes referred to as "underfill", is typically applied after the solder bumps are reflowed to bond the semiconductor device to the substrate. The underfill is dispensed onto the substrate adjacent to the chip and is pulled into the gap by capillary forces. Thereafter, the precursor is heated, polymerized and "cured" to form an encapsulant. These approaches become increasingly insufficient as the number of bump interconnections increases and the bump size and the bump center-to-center pitch shrink. With these trends, the number of voids in the underfill and the risk of clustering the fillers in the precursor increase sharply.

SUMMARY

Applicants recognize the need for an assembly methodology, material preparation and fabrication technique that provide not only stress-free, but also void-free underfilling. The methodology is based on the careful control of the parameters determining the phenomenon of capillarity.

One embodiment of the invention is a method for assembling a semiconductor device. A chip with reflow bodies on its contact pads is flipped onto a substrate. After the reflow process, a gap spaces chip and substrate apart. A polymer precursor is selected for its viscosity of known temperature dependence. An apparatus is then provided, which has a plate with heating and cooling means to select and control a temperature profile in time and from location to location across the plate. After preheating, substrate and chip are placed on the plate for reaching the temperature profile. A quantity of the precursor is deposited at a chip side and pulled into the gap by capillary action. The capillary flow is controlled by controlling the viscosity based on the temperature profile. As a result, the polymer progresses in a substantially linear front, until the gap is filled with polymer substantially without voids.

Another embodiment of the invention is an apparatus with a plate operable to acquire a surface temperature of controlled profile. Inside the plate are means for local heating, and across the plate surface are movable capillaries, which have nozzles of controlled openings suitable for air flow. Air of controlled temperature can be pressured through the capillary nozzles. Temperature sensors are distributed in the plate, operable in a feedback mode to select and control the temperature of the plate surface from location to location.

It is a technical advantage of the invention that the assembly process is simple and low-cost, applicable to large-chip semiconductor products, high numbers and small size of bumps, and fine bump pitch. At the same time, the method is flexible and can be applied to a wide spectrum of material and process variations, leading to improved semiconductor device reliability.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
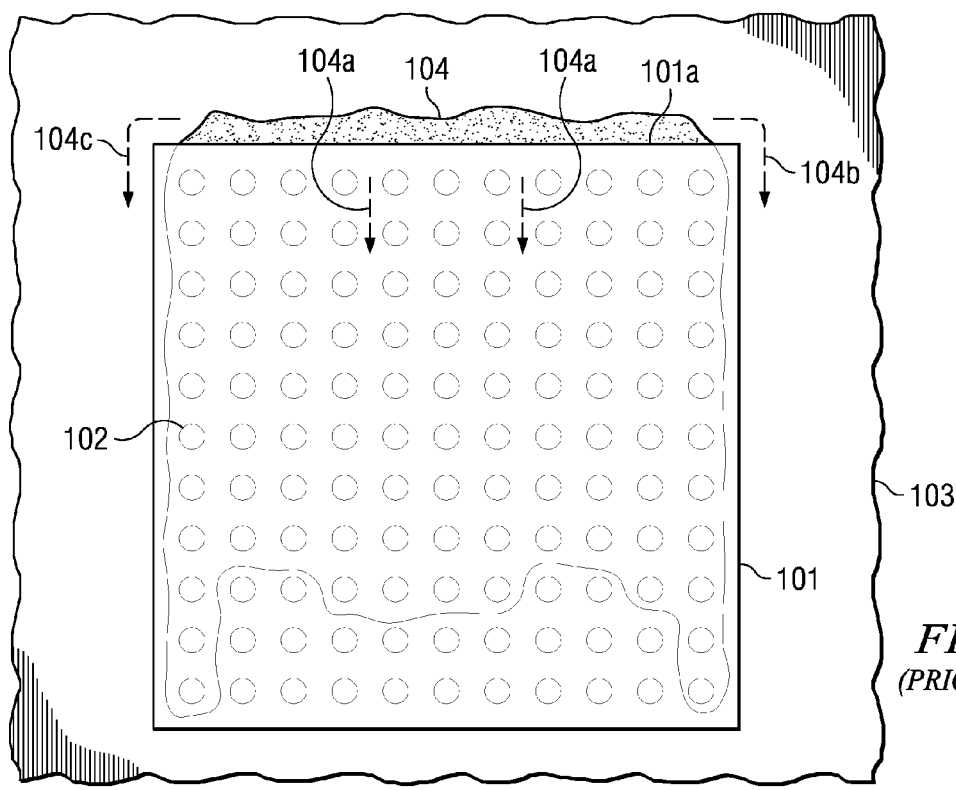
FIG. 1 is a schematic X-ray top view of a semiconductor chip attached by solder balls to a substrate, while underfill material moves through the chip-substrate gap in an irregular front in known technology.
Figure 2:
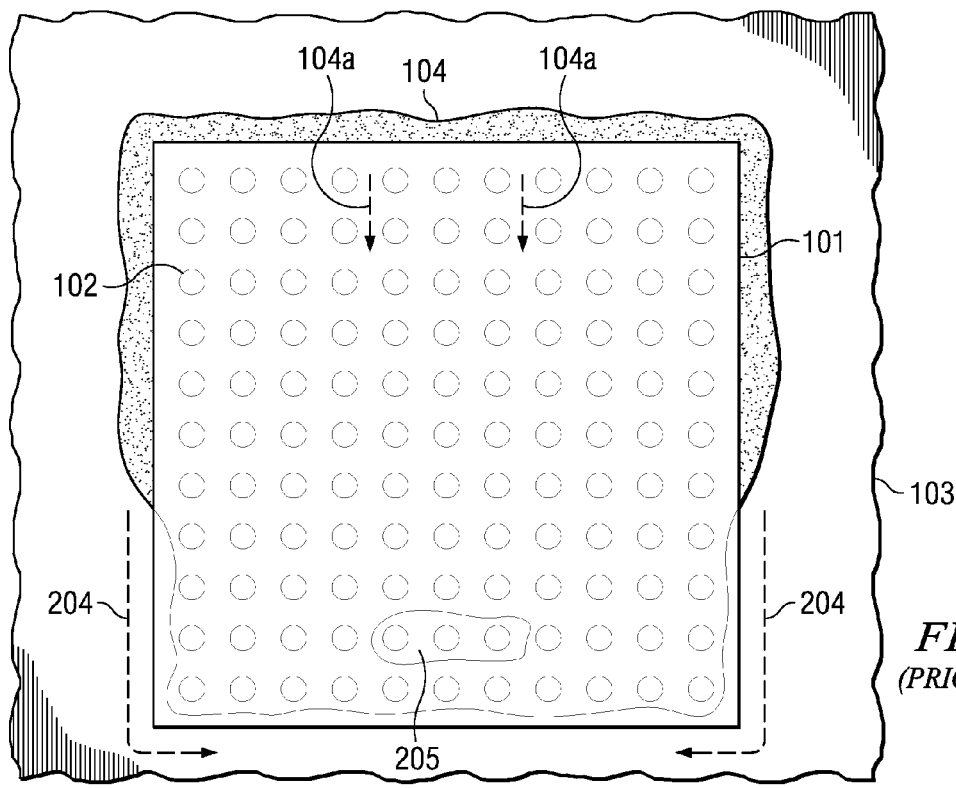
FIG. 2 is a schematic X-ray top view of a semiconductor chip attached by solder balls to a substrate, while underfill material has filled the chip-substrate gap incompletely (causing a void) in known technology.

The schematic top X-ray views of FIGS. 1 and 2 illustrate a typical example of an underfill process in known technology of a semiconductor chip assembled on a substrate. Looking through the flip-assembled transparent chip 101, FIGS. 1 and 2 show rows of solder connections 102 connecting the chip and to the substrate 103 (also transparent). The solder connections 102 between chip 101 and substrate 103 create a gap. A quantity of liquid, viscous polymeric material 104 is deposited along chip side 101a for filling this gap; capillarity pulls the polymer into the gap and provides the mechanism for filling.

Capillarity is the capillary action by which the surface of a liquid, where it contacts a solid, is elevated or depressed, because of the relative attraction of the molecules of the liquid for each other and for those of the solid. Capillary attraction is the force of adhesion existing between a solid and a liquid in capillarity.

Capillary action becomes effective, when a positive force of adhesion exists between the wettable solid surface of a capillary tube or gap, and a wetting liquid inside the tube or gap ("capillary attraction"). In an approximately horizontal tube or gap, the pulling force moves the liquid along the tube or gap.

FIG. 1 illustrates the problematic behavior of the liquid polymeric material 104 (dark color in the gap) in known technology. While a portion 104a is being pulled into the chip-to-substrate gap, other portions 104b and 104c flow along adjacent sides of the chip and start from different angles to be pulled into the gap. The arrows in FIG. 1 indicate schematically this complex situation. As a consequence, the merging of the fronts from different angles results in an irregular effective progression front, with the center portion of the front moving slower and the portions along the chip sides faster.

FIG. 2 depicts the substantial risk of trapping air pockets along the progression. The accelerated portions 204 have merged; finally they enclose air pocket 205. The captured void 205 causes stress irregularities and thus a high risk of device failure. These difficulties are resolved by the embodiments of the invention.

For the assembly process of the invention and the design of the apparatus, the invention applies certain laws of fluid dynamics and deformable medium and extends them to the complex conditions of semiconductor product fabrication.

For a deformable medium flowing in a gap having different cross sections q in various parts, continuity requires that the amount of deformable medium flowing per unit of time through each cross section is directly proportional to q and to the velocity v in this cross section:

$$q\,v = \text{const.}$$

In a gap, a deformable medium flows fastest at the smallest cross section.

The velocity v of the flowing medium of density $\rho$ is correlated to its pressure p after BERNOULLI by $$\tfrac{1}{2}\rho v^2 + p = \text{const.}$$

The pressure of a flowing medium is the smaller the greater its velocity is. Consequently, the pressure at the smaller cross sections is smaller than at the larger cross sections.

When the parts of the gap with different cross sections are separated by different lengths L of the gap, one also has to consider the drop of pressure along the gap lengths; the drop, in turn, depends on the characteristics of the flow, laminar versus turbulent.

A deformable medium flowing in a portion of a gap of radius r and length L at a velocity v, averaged over the gap portion cross section, experiences a pressure drop $\Delta p$ due to friction. For idealized conditions, such as neglecting the inertia of the flowing medium, HAGEN and POISEUILLE have found for laminar flow $$\Delta p = 8\eta L v / r^2.$$

($\eta$=dynamic viscosity)

The pressure drop of the medium along the gap portion length is directly proportional to the first power of the average velocity and inverse proportional to the second power of the portion radius.

In contrast, for turbulent flow the relationship is $$\Delta p = \rho \lambda L v^2 / r.$$

($\rho$=density, $\lambda$=dimensionless number related to REYNOLD's criteria of transition from laminar to turbulent flow).

The pressure drop of the medium along the gap portion length is directly proportional to the second power of the average velocity and inverse proportional to the first power of the portion radius.

Figure 3:
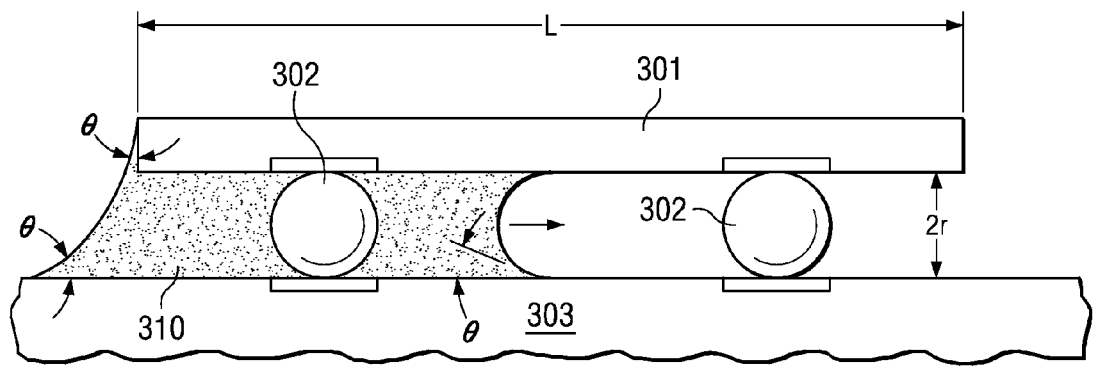
FIG. 3 is a schematic cross section of a chip attached by solder balls to a substrate, illustrating the capillary action of filling the gap with a viscous material.

FIG. 3 illustrates the capillary conditions in the gap of width 2r (determined by the height 2r of the solder connections 302) between chip 301 and substrate 303. With these designations, the flow-out t is given by:

$$t = (3\eta / \gamma \cos \theta)(L^2 / 2r)$$

($\gamma$=surface tension)
($\theta$=contact angle)

The flow-out time is directly proportional to the square of the flow distance and inverse proportional to the capillary width (after J. WANG, Microelectr. Reliab. 42, 293-299, 2002). The equation is only approximately correct and does not comprehend the time dependence of material parameters. FIG. 3 also shows the meniscus 310 of the fillet at the side edge of chip 301; it is also characterized by contact angles $\theta$. Analogous considerations hold, when 301 in FIG. 3 is a packaged semiconductor device.

Figure 4:
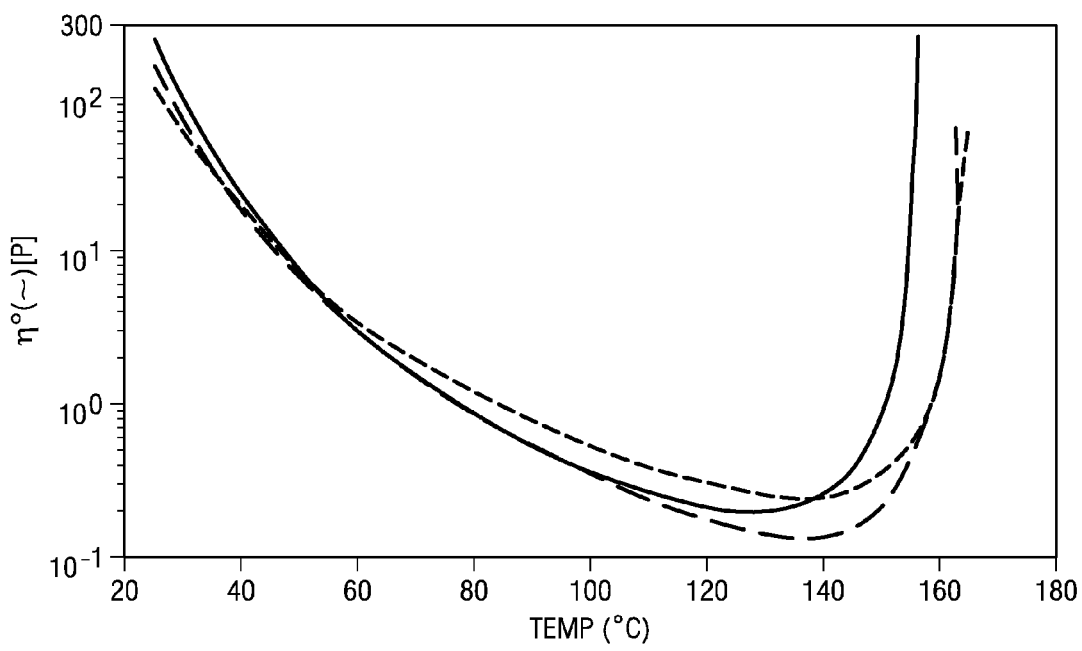
FIG. 4 is a plot of the dynamic viscosity $\eta$ of polymer precursors (logarithmic scale) as a function of temperature (linear scale).

The above relations for the laminar flow and the flow-out time highlight the importance of the dynamic viscosity $\eta$. By increasing the temperature and thus decreasing the viscosity, the pressure drop of the flowing precursor can be decreased, the velocity increased, and the flow-out time decreased. The detailed dependence of the viscosity $\eta$ (poise, logarithmic scale) on temperature (° C., linear scale) for several polymer precursor materials is plotted in FIG. 4. The viscosity drops sharply (about three orders of magnitude) in the temperature range from ambient temperature to about 130 to 140° C. Polymer precursors with a viscosity dependence as plotted in FIG. 4 are commercially available, for example from Ablestik Corp., Rancho Dominguez, Calif., USA.

The polymer preferably includes inorganic filler particles (such as alumina or silica) selected to strengthen the polymerized polymer mechanically and reduce its coefficient of thermal expansion. The largest diameter of the filler particles is preferably less than approximately 30% of the gap, amplifying the regulating effect of the viscosity change.

Figure 5:
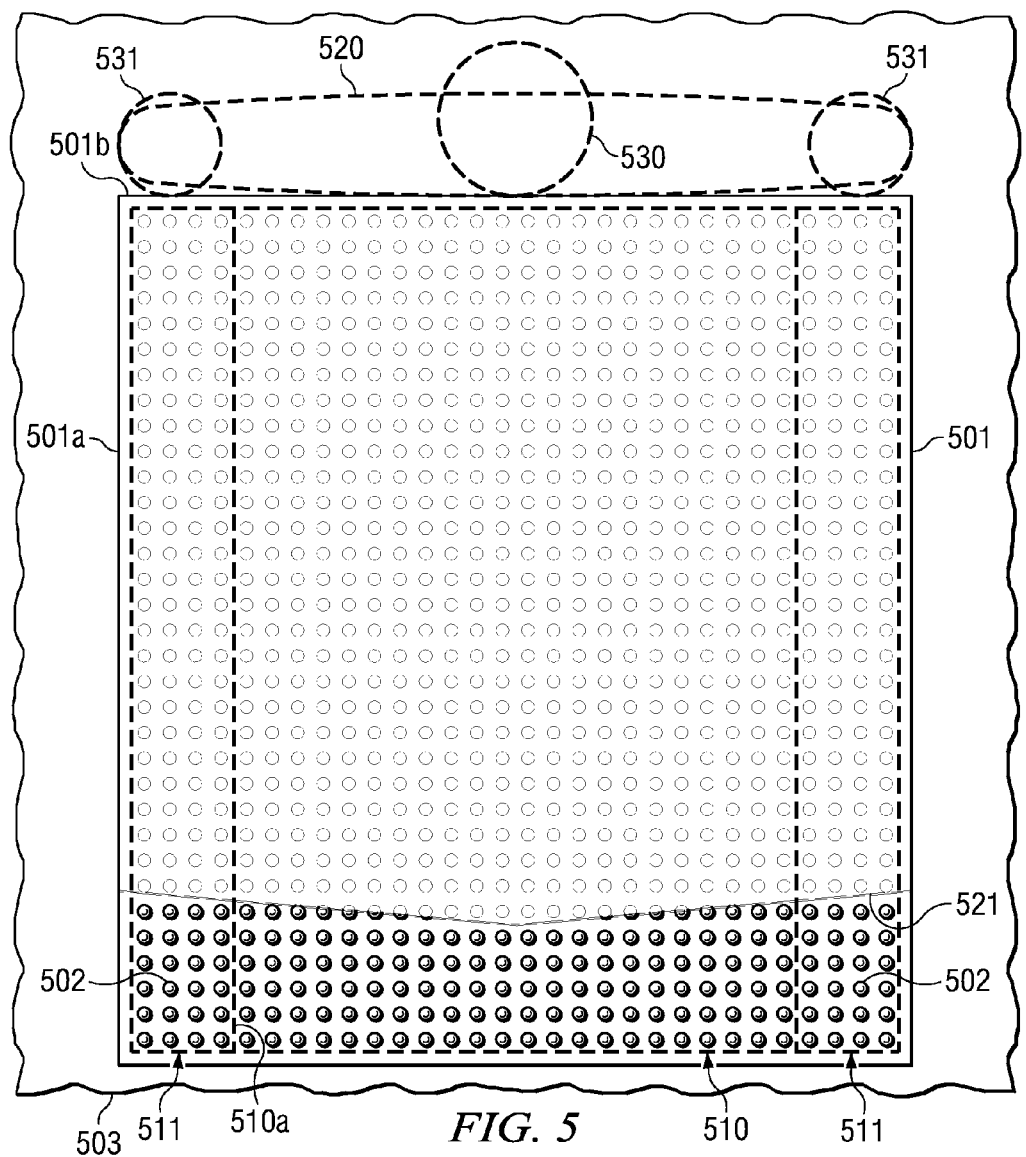
FIG. 5 is a schematic X-ray top view of a semiconductor chip attached by solder balls to a substrate, with an embodiment of high and low temperature zones causing underfill material to move through the chip-substrate gap in a regular front.
Figure 6:
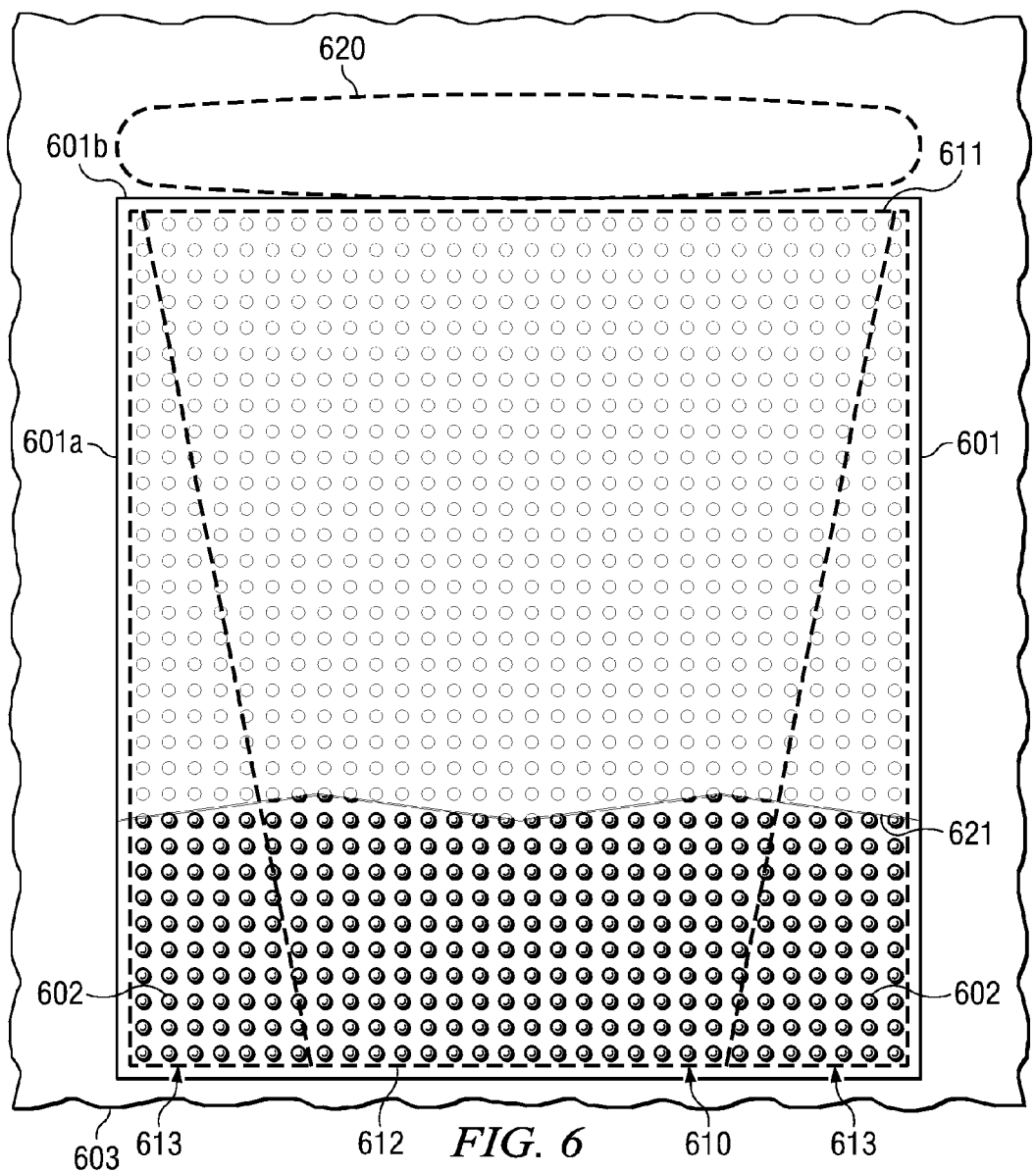
FIG. 6 is a schematic X-ray top view of a semiconductor chip attached by solder balls to a substrate, with another embodiment of high and low temperature zones causing underfill material to move through the chip-substrate gap in a regular front.

The schematic top X-ray views of FIGS. 5 and 6 show embodiments of the invention, a thermal method to control the flow of a polymer precursor in the underfilling process of a flip-assembled semiconductor chip with metallic contact pads. In FIG. 5, looking through the flip-assembled transparent chip 501 outlined by its sides 501a, a dense array of solder bodies 502 can be seen, which are attached to each contact pad and connect chip 501 with substrate 503 (also transparent). The chip 501 is preferably a semiconductor component such as a high input/output silicon integrated circuit. The solder bodies are preferably balls or bumps made of tin-based compounds (such as tin/silver, tin/copper, tin/bismuth, or ternary compounds) with a reflow temperature higher than the temperature used for controlling the precursor viscosity. The substrate 503 may be ceramic or plastic, with or without lamination, or glass. The surface of the substrate has metallic terminals in locations matching the chip contact pads.

In the process of attaching chip 501, with the solder bodies attached to its contact pads, to the substrate 503, chip and substrate are aligned so that each chip solder body is aligned with and touches the matching substrate terminal. Thermal energy is then applied to reflow the solder bodies. The attached chip 501 and substrate 503 are cooled to a predetermined temperature (which may still be significantly higher than ambient temperature); an assembly between chip and substrate is thus created with a gap spacing the chip and the substrate apart. An example of the gap is indicated in FIG. 3.

Next, an adherent polymer precursor is selected, preferably filled with inorganic fillers, on the basis of its temperature dependent viscosity. The dependence, generally depicted in FIG. 4, permits the selection of the high and the low temperatures for the assembly zones to create the precursor viscosity differences best suited for a precursor flow with linear front through the assembly gap.

An apparatus is now provided, which has a heatable plate with a surface contoured into castellated mesas. The apparatus further includes several capillaries with openings formed to create a jet of streaming gas, which preferably is cooled to a temperature below ambient temperature. In addition, the apparatus has at least one syringe with a nozzle designed to dispense the selected filler-loaded precursor. The apparatus and its variations is described in more detail below. The plate is preheated to reach a predetermined temperature.

The chip-on-substrate assembly, as described above, is placed—substrate down—on a plate mesa, so that the heated mesa can transfer heat to that portion of the substrate, which is intended to acquire the temperature of the plate. In the embodiment of FIG. 5, the elevated temperature zone 510 stretches over a center portion of the chip and has outlines 510a about parallel to the chip sides 501a.

Next, the capillaries, which are movable in three dimensions, are moved above the chip surface of the assembly and positioned over the ship surface approximately parallel to the chip sides 501a. Dependent on the size of the chip, two or three or more capillaries are required on each side of the chip. Alternatively, one or more capillaries may be moved along the assembly side to face the gap (or one or more solder bodies). Gas such as dry nitrogen or dry air is then pressured through the capillaries to create a stream of gas flowing out of the capillary opening, hitting the chip surface; the gas streams at a controlled rate. Preferably, the gas is cooled, more preferably in the temperature range from about −10 to +20° C.; a controlled stream of cooled gas at a controlled temperature is thus hitting the chip surface, locally cooling the chip and, by conductance through the solder bodies, the substrate. In FIG. 5, the cool temperature zones 511 stretch along the two chip sides 501a and are juxtaposed the heated zone 510, creating a temperature profile across the assembly. The transition zone between the heated and the cooled zones stretches preferably between 1 and 6 mm (see FIG. 7).

Figure 9:
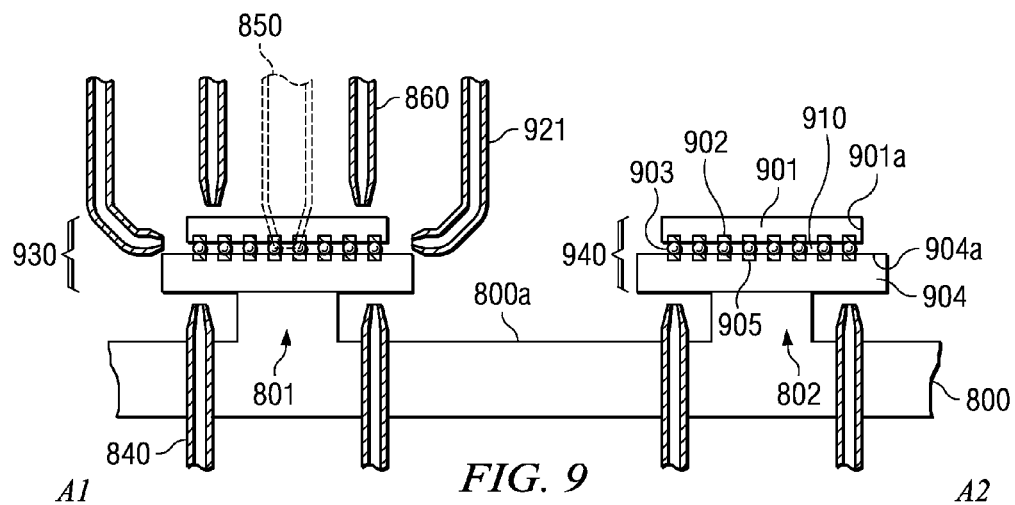
FIG. 9 depicts schematically a cross section of the heatable plate with mesas, inlets for cooling gas, capillaries for cooling gas, and a syringe for precursors; the cross section is along line A1-A2 of FIG. 8.

As illustrated in FIG. 9, another embodiment of the cooling capillaries employs curved capillaries, which are shaped to provide cooled gas jets directly into the gap, thus greatly enhancing the cooling effect, which the gas exerts on the surfaces of the gap.

Next, at least one syringe, which is movable in three dimensions, is moved to chip side 501b of the assembly. The syringe has an opening suitable for dispensing a polymer precursor of a controlled temperature. A quantity 520 (dashed outline in FIG. 5) of the selected liquid viscous precursor is deposited along chip side 501b for filling the gap. While the precursor is pulled into the gap by capillary action, its viscosity is modified by the temperature profile. Consequently, the precursor moves faster in the heated zone and slower in the cooled zones, where the capillary force is stronger. The result illustrated in FIG. 5 indicates that the front 521 of the penetrating precursor is substantially linear, and it keeps its linear shape for the full capillary movement through the gap. Consequently, there is no longer a risk of leaving a void behind or forming an enclosed volume of air (as in FIG. 2).

Alternatively, multiple syringes are moved to the chip side 501b; a preferred number of syringes is three, as shown in FIG. 5. The syringes have openings suitable for dispensing a polymer precursor. In one embodiment, the syringes dispense the same precursor material, but the material 530 from the center syringe is at a higher temperature than the materials 531 from the outer syringes; consequently, the precursor viscosity is lower in the center and higher in the regions of greater capillary force. In another embodiment, the syringes dispense precursor materials of different viscosities, or altogether different precursor materials. It is preferred that the material 530 from the center syringe has a lower viscosity than the materials 531 from the outer syringes. The viscosities are higher in regions of greater capillary force; consequently, in all these modifications, the front 521 of the penetrating precursor materials is substantially linear, and the front keeps its linear shape for the full capillary movement through the gap.

The method further includes the steps polymerizing the precursor at an elevated temperature, and then to cool the assembly together with the precursor to ambient temperature.

FIG. 6 illustrates another embodiment with a modified zone of elevated temperature/lower viscosity and the resulting substantially linear flow of a polymer precursor in the underfilling process of a flip-assembled semiconductor chip with metallic contact pads. In FIG. 6, looking through the flip-assembled transparent chip 601 outlined by its sides 601a, 601b, and 601c, a dense array of solder bodies 602 can be seen, which are attached to each contact pad and connect chip 601 with substrate 603 (such as a ceramic or a plastic laminated substrate, but transparent in FIG. 6). The surface of the substrate has metallic terminals in locations matching the chip contact pads.

When chip 601 and substrate 603 are connected by reflowing solder bodies 602, a gap is created, which spaces the chip and the substrate apart.

Next, an adherent polymer precursor is selected, preferably filled with inorganic fillers, on the basis of its temperature dependent viscosity. The dependence, generally depicted in FIG. 4, permits the selection of the high and the low temperatures for the assembly zones to create the precursor viscosity differences best suited for a precursor flow with linear front through the assembly gap.

The apparatus provided has a heatable plate with a surface contoured into castellated mesas. The mesas are configured with a surface of a trapezoidal outline: Of the four sides, two opposing sides are parallel to each other, while the two other sides are inclined against each other. After heating the plate with the mesas, tapered zones 610 of elevated temperature can be formed; the width of the zone tapers from the wide side 611 to the narrow side 612. The apparatus further includes several capillaries with openings formed to create a jet of streaming gas, which preferably is cooled to a temperature below ambient temperature. In addition, the apparatus has at least one syringe with a nozzle designed to dispense the selected filler-loaded precursor.

First, the plate is preheated to reach a predetermined temperature. Next, a chip-on-substrate assembly is placed—substrate down—on one of the mesas so that it can reach the temperature profile of FIG. 6. The cooler zones 613 on each side of the chip start narrow on chip side 601b and become gradually wider towards chip side 601c.

Next, the capillaries, which are movable in three dimensions, are moved above the chip surface of the assembly and positioned over the ship surface approximately following the trapezoidal mesa sides. For many chip sizes, three or more capillaries are required on each side of the chip. Gas such as dry nitrogen or dry air is then pressured through the capillaries to create a stream of gas flowing out of the capillary opening, hitting the chip surface; the gas streams at a controlled rate. Preferably, the gas is cooled, more preferably in the temperature range from about −10 to +20° C.; a controlled stream of cooled gas at a controlled temperature is thus hitting the chip surface, locally cooling the chip and, by conductance through the solder bodies, the substrate.

Next, a syringe movable in three dimensions is moved to chip side 601b of the assembly. The syringe has an opening suitable for dispensing a polymer precursor of a controlled temperature. A quantity 620 (dashed outline in FIG. 6) of the selected liquid viscous precursor is deposited along chip side 601b for filling the gap. While the precursor is pulled into the gap by capillary action, its viscosity is modified by the temperature profile. Consequently, the precursor moves faster in the heated zone and slower in the cooled zones. The result illustrated in FIG. 6 indicates that the front 621 of the penetrating precursor is substantially linear, and it keeps its linear shape for the full capillary movement through the gap. Consequently, there is no longer a risk of leaving a void behind or forming an enclosed volume of air (as in FIG. 2).

Figure 7:
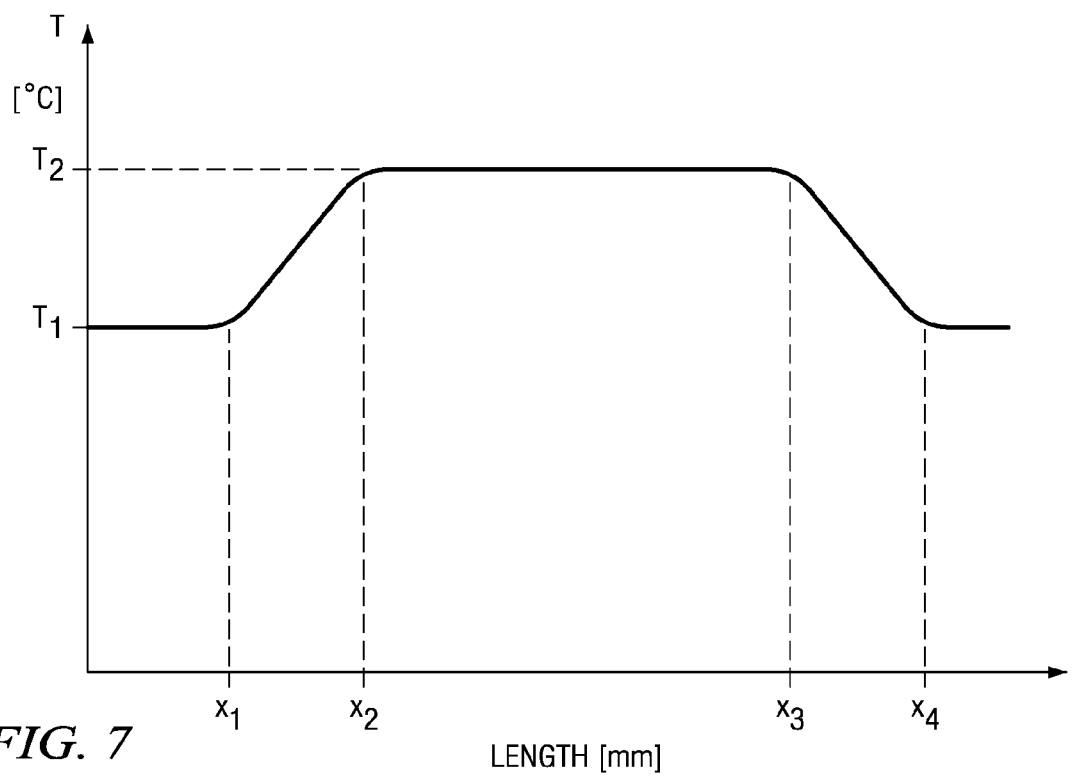
FIG. 7 is a schematic plot of temperature versus location illustrating the temperature profile across a semiconductor/substrate assembly.

As illustrated in FIG. 7, it is preferred for many precursor materials to profile the elevated temperature zone of the chip-and-substrate assembly (510 in FIG. 5, 610 in FIG. 6) so that the center portion from $x_2$ to $x_3$ has an approximately flat temperature value at $T_2$ (in the 95 to 110° C. range), while the adjacent cooler side ranges (511 in FIG. 5, 613 in FIG. 6) are flat at a temperature $T_1$ (in the 60 to 85° C. range). Between the high and the low temperature regimes (between $x_1$ and $x_2$ and between $x_3$ and $x_4$) are temperature gradients; preferably the gradient should be more than 5° C. over a distance of about 1 to 6 mm.

Figure 8:
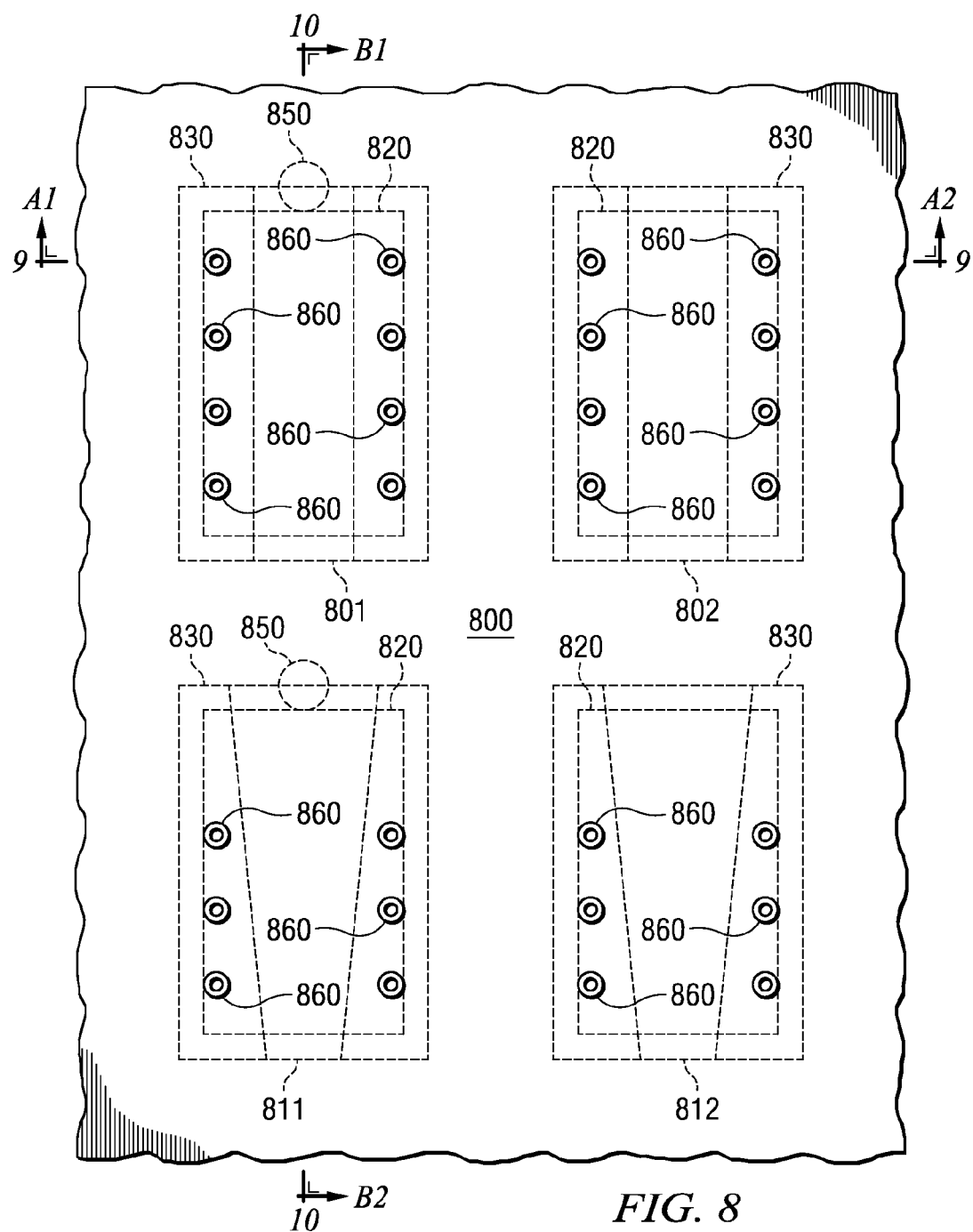
FIG. 8 illustrates schematically a top view of a heatable plate with mesas of various shapes and inlets of cooling gas; the positions of chips, substrates, and syringes are indicted by dashed/dotted lines.
Figure 10:
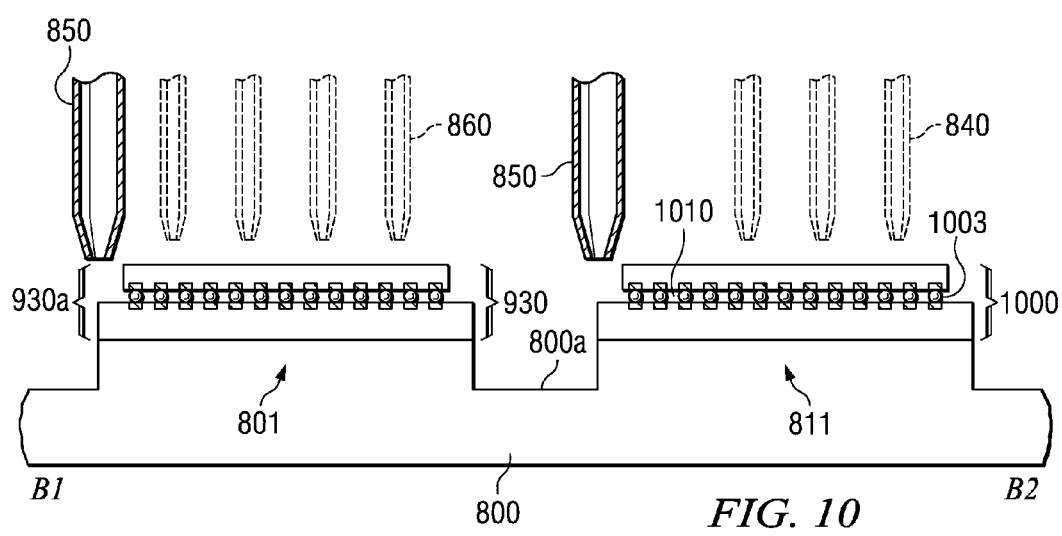
FIG. 10 depicts schematically a cross section of the heatable plate with mesas, capillaries for cooling gas, and a syringe for precursors; the cross section is along line B1-B2 of FIG. 8.

FIGS. 8, 9 and 10 depict views of the apparatus used for creating and controlling the temperature profile of a flip-chip-and-substrate assembly to provide a linear front in the underfilling process. FIG. 8 represents a top view of the apparatus, combining a number of equipment variations in a single drawing; FIG. 9 is a cross sectional view along line A1-A2, also including a number of apparatus options in one drawing; and FIG. 10 is a cross sectional view along line B1-B2.

FIG. 8 illustrates a (controllably heatable) metal plate 800 with a body, from which rows of mesas are protruding. Each mesa top is shaped to support at least a portion of the substrate of a semiconductor flip-chip assembly. In the preferred plate configuration, the surface area of the mesas is smaller than the area of the substrate assembly placed on the mesas. It should be pointed out that in order to create reproducibly the desired temperature profile in a selected semiconductor assembly, all mesas preferably have the same size and surface contour; the desired profile is created by the combination of heating and cooling (see below). However, in order to illustrate several design options, FIG. 8 includes more than one mesa surface design.

In FIG. 8, the mesas 801, 802, etc. in the first row have a rectangular surface, the mesas 811, 812, etc. of the second row have a trapezoidal surface. Other mesas may have different surface geometries; they are not shown in FIG. 8. For the mesa size selected, FIG. 8 also shows a suitable chip size 820 and substrate size 830.

In order to monitor the temperature for controlling the temperature profile, a plurality of temperature sensors may be distributed in plate 800 and in the mesas; the sensors are not shown in FIG. 8.

In addition, FIG. 8 depicts a number of plate inlets 840 for blowing cooled gas from below the plate 800 onto the assembly-being-processed. The inlets may be provided for any mesa design (not only for rectangular mesas), and in any number and position. Furthermore, the preferred location of the syringe dispensing the polymer precursor is outlined by the dashed circle 850.

FIG. 9 is a cross section of a portion of the heatable plate 800 along line A1-A2 in FIG. 8. The mesas 801 and 802 protrude from the surface 800a of the plate. Near the mesas are openings 840, which are suitable for blowing gas from the bottom through the plate towards an assembly positioned on the mesa.

FIG. 9 illustrates a semiconductor assembly positioned on each of the mesas; in FIG. 9, the assemblies belong to the same semiconductor type; alternatively, they may be different. The assembly on mesa 801 is designated 930, the assembly on mesa 802 is designated 940. In FIG. 9, both assemblies include a semiconductor chip 901 outlined by sides 901a and metallic pads 902. Solder bodies 903, such as tin alloys, are attached to pads 902. The assemblies further include a substrate 904 with surface 904a and metallic terminals 905 in locations matching the chip pads 902. The solder bodies 903 are also attached to pads 905 so that a gap 910 is created, which spaces chip 901 and substrate 904 apart.

The apparatus of FIG. 9 further includes several capillaries 840. The capillaries are movable, individually or as a group, in x-, y-, and z-direction. In FIG. 9, the capillaries are positioned over assembly 930; after completing the underfill step, they will be mover over assembly 940. The capillaries have a diameter and an orifice suitable for pressing gas through the capillary to let it stream onto a surface positioned at a distance from the opening. In the example of FIG. 9, the gas jet hits the passive surface of semiconductor chip 901 flip-assembled on substrate 904. Preferably, the gas is flowing at a controlled rate, and is cooled to a temperature below ambient temperature, preferably between about −10 and +20° C. In the preferred embodiment, the gas is dry nitrogen. From the cooled surface location, the cooling effect spreads through the semiconductor thickness of the chip and the solder bodies 903 to the substrate 904.

The capillaries may have straight shape, as shown by examples 840 in FIG. 9, or they may be curved as indicated by the examples 921. In the latter configuration, the capillary orifice points towards the assembly gap 910 and thus enables the cooled gas to hit directly some solder bodies 903 close to the perimeter of the assembly and certain surface locations of the substrate 904, thereby significantly enhancing the cooling effect.

In dashed outline, FIG. 9 indicates the preferred position of the capillary 850 used to dispense, at one face of the assembly, the polymer precursor material needed for the underfilling process of the assembly. The precursor is at a controlled temperature. In another embodiment, the apparatus may have multiple (e.g., three) dispensing capillaries positioned side by side along the assembly face; they even may have different orifices for different rates of dispensing (see the larger dashed circle 530 in FIG. 5 compared to the smaller circles 531). In a first embodiment, the multiple (e.g., three) syringes are used for the same precursor; the precursor in the center syringe, however, has a higher temperature than the materials in the adjacent syringes. In a second implementation, the syringes are used for different types of precursors. Preferably, the center syringe has a precursor type with a lower viscosity than the precursor type in the adjacent syringes.

FIG. 10 is a cross section of a portion of the heatable plate 800 along line B1-B2 in FIG. 8. The mesas 801 and 811 protrude from the surface 800a of the plate. FIG. 10 illustrates a semiconductor assembly, composed of a semiconductor chip and a substrate, positioned on each of the mesas. The assembly 930 (same as in FIG. 9) is placed on mesa 801, the assembly 1000 on mesa 811. In FIG. 10, assemblies 930 and 1000 are of the same device type; in other embodiments, they may be of different device types. Solder bodies 1003, such as tin alloys, are connecting chips and substrate so that a gap 1010 is created, which spaces chips and substrates apart.

The apparatus of FIG. 10 further includes the capillary 850, which is used to dispense, at the face 930a of the assembly, the polymer precursor material needed for the underfilling process of the assembly. The precursor is at a controlled temperature. In another embodiment, the apparatus may have three dispensing capillaries positioned side by side along the assembly face 930a; they even may have different orifices for different rates of dispensing (see the larger dashed circle 530 in FIG. 5 compared to the smaller circles 531). In a first implementation, the three syringes are used for the same precursor; the precursor in the center syringe, however, has a higher temperature than the materials in the adjacent syringes. In a second implementation, the syringes are used for different types of precursors. Preferably, the center syringe has a precursor type with a lower viscosity than the precursor type in the adjacent syringes.

The apparatus in FIG. 10 further includes several capillaries 840, shown in dashed outlines. The capillaries are movable, individually or as a group, in x-, y-, and z-direction. The capillaries have a diameter and an orifice suitable for pressing gas through the capillary to let it stream onto a surface positioned at a distance from the opening. In the example of FIG. 10, the gas jet hits the passive surface of the semiconductor chip flip-assembled on the substrate of assembly 930. Preferably, the gas is cooled to a temperature below ambient temperature. From the cooled surface location, the cooling effect spreads through the semiconductor thickness of the chip and the solder bodies to the substrate.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the embodiments are effective in semiconductor chips and any other chips with contact pads, which have to undergo assembly on a substrate or printed circuit board followed, including the process of underfilling the gap between chip and substrate. As another example, the semiconductor devices may include products based on silicon, silicon germanium, gallium arsenide and other semiconductor materials employed in manufacturing. As yet another example, the concept of the invention is effective for many semiconductor device technology nodes and not restricted to a particular one.

As another example, the method disclosed can be applied to void-free filling of gaps between any substrates or other external parts which are interconnected by spacing elements or otherwise kept at a distance, when different viscosities of adjacent filling materials can be formed to control capillary action. The method can generally be applied to fabricate void-free fillings between solid parts (including glass pates), when portions of the parts can be kept at temperatures different from the remainder of the parts, or when syringes with a precursor at different temperatures are used, or when syringes with precursors of different viscosities are employed.

It is therefore intended that the appended claims encompass any such modifications or embodiments.

We claim:

1. An apparatus for semiconductor flip-chip assembly comprising:
   a plate having a body and a surface heatable to a controlled temperature profile;
   mesas protruding from the surface, each mesa configured to support at least portion of a semiconductor assembly, the mesas having the same temperature as the plate, wherein the temperature is monitored by a plurality of temperature sensors in the plate and the mesas;
   capillaries above the mesas, the capillaries movable in three dimensions, each capillary having an opening suitable for flowing gas for further controlling the temperature profile by blowing cooled gas onto the semiconductor flip-chip assembly on the surface; and
   at least a first syringe movable in three dimensions, the syringe having an opening suitable for dispensing a polymer precursor.

2. The apparatus according to claim 1 wherein the gas is flowing at a controlled rate.

3. The apparatus according to claim 1 wherein the gas is controllably cooled to a temperature from about −10 to +20° C.

4. The apparatus according to claim 1 wherein the polymer precursor is at a controlled polymer precursor temperature.

5. The method of claim 1, in which controlling the temperature profile across the semiconductor flip-chip assembly includes adding heat to a zone of elevated temperature and removing heat from a low temperature zone concurrently.

6. The method of claim 1, in which at least one capillary has a straight shape and at least one capillary is curved.

7. The method of claim 1, further comprising at least a second syringe moveable independent from the first syringe designed to dispense the polymer precursor.

8. The method of claim 7, in which the two syringes contain adhesive precursors of two different polymer precursor temperatures.

* * * * *